United States Patent
Yoshida et al.

(10) Patent No.: US 7,733,393 B2
(45) Date of Patent: Jun. 8, 2010

(54) DIGITAL CAMERA COMPRISING SMEAR REMOVAL FUNCTION

(75) Inventors: Toshihiko Yoshida, Fussa (JP); Kazuyuki Kurosawa, Iruma (JP)

(73) Assignee: Casio Computer Co., Ltd., Tokyo (JP)

( * ) Notice: Subject to any disclaimer, the term of this patent is extended or adjusted under 35 U.S.C. 154(b) by 999 days.

(21) Appl. No.: 11/435,532

(22) Filed: May 17, 2006

(65) Prior Publication Data

US 2006/0274173 A1     Dec. 7, 2006

(30) Foreign Application Priority Data

May 19, 2005   (JP) .............................. 2005-146647

(51) Int. Cl.
   *H04N 9/64*    (2006.01)
(52) U.S. Cl. ...................................... 348/249; 348/245
(58) Field of Classification Search ................. 348/245, 348/248, 249
   See application file for complete search history.

(56) References Cited

U.S. PATENT DOCUMENTS

| | | | |
|---|---|---|---|
| 4,547,807 A | | 10/1985 | Mitani et al. |
| 5,608,455 A | * | 3/1997 | Oda ............................ 348/295 |
| 5,661,521 A | | 8/1997 | Curtis et al. |
| 6,970,193 B1 | * | 11/2005 | Kidono et al. ............... 348/245 |

| | | | |
|---|---|---|---|
| 2004/0169896 A1 | | 9/2004 | Kondo |

FOREIGN PATENT DOCUMENTS

| | | |
|---|---|---|
| EP | 0748113 A2 | 12/1996 |
| JP | 2001-086413 A | 3/2001 |

OTHER PUBLICATIONS

Notification of Transmittal of the International Search Report for PCT/JP2006/310290, and Written Opinion of the International Searching Authority, 14 sheets.

* cited by examiner

*Primary Examiner*—David L Ometz
*Assistant Examiner*—Dillon Durnford-Geszvain
(74) *Attorney, Agent, or Firm*—Frishauf, Holtz, Goodman & Chick, P.C.

(57) ABSTRACT

A horizontal evaluation data generation section calculates an average value of pixel signals in a vertical optical black region based on given pixel data in the horizontal optical black region and outputs the calculated average value to an evaluation section. A vertical evaluation data generation section calculates an average value of pixel signals in a vertical optical black region based on given pixel data in the vertical optical black region and outputs the calculated average value to the evaluation section. The evaluation section outputs a gain value according to the difference between the two sent average values to a computing section. A smear information memory stores pixel signals in a line in the vertical optical black region. The computing section multiplies the pixel data stored in the smear information memory by the sent gain value, and subtracts the multiplied pixel data from the pixel data imaged by the CCD 5.

13 Claims, 13 Drawing Sheets

READOUT DIRECTION IN HORIZONTAL DIRECTION

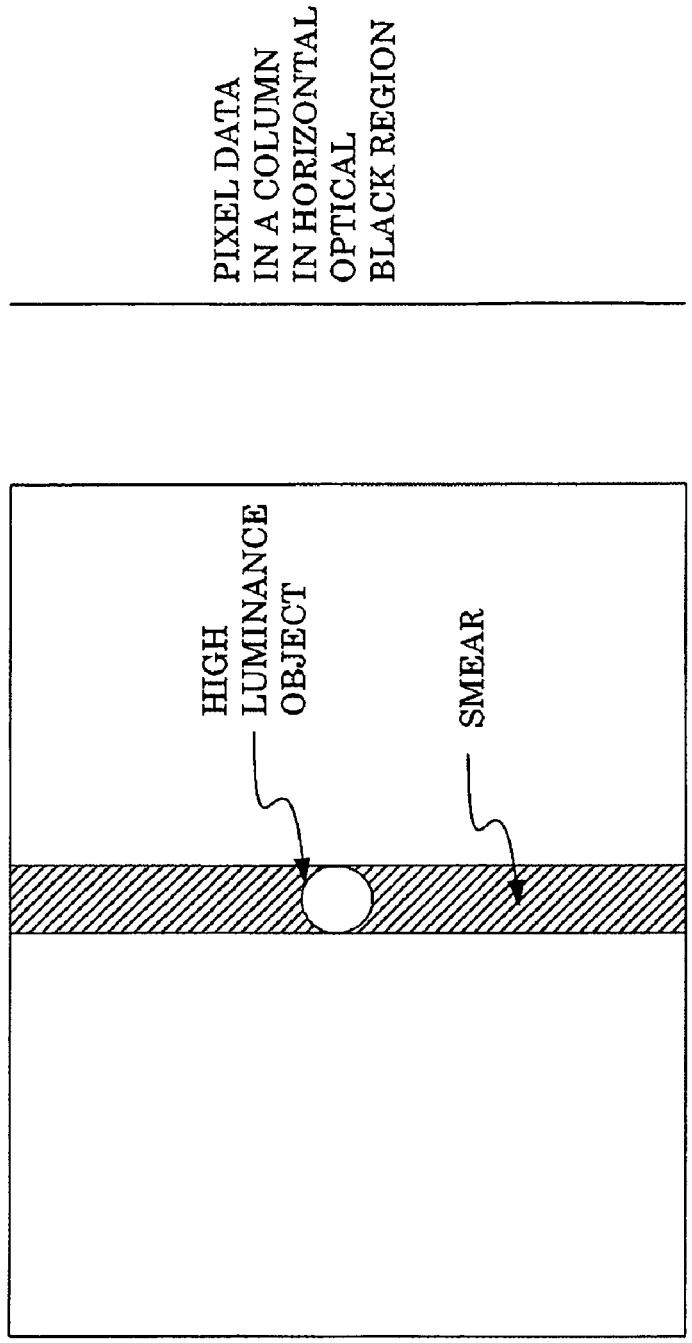
FIG. 3C
FIG. 3A
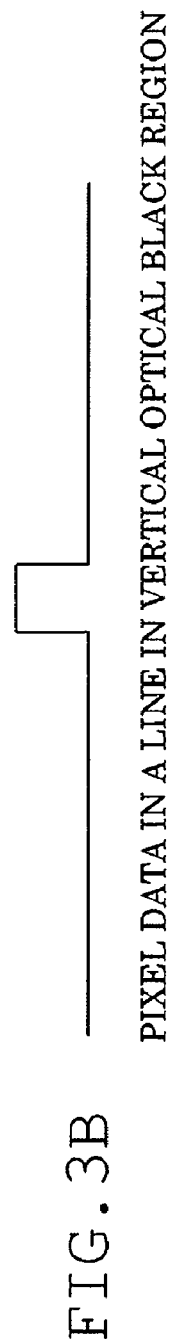
FIG. 3B

PIXEL DATA IN A LINE IN VERTICAL OPTICAL BLACK REGION 2

PIXEL DATA IN A LINE IN VERTICAL OPTICAL BLACK REGION 1

# DIGITAL CAMERA COMPRISING SMEAR REMOVAL FUNCTION

CROSS-REFERENCE TO RELATED APPLICATION

This application is based upon and claims the benefit of priority from the prior Japanese Patent Application No. 2005-146647, filed May 19, 2005, the entire contents of which is incorporated herein by reference.

BACKGROUND OF THE INVENTION

1. Field of the Invention

The present invention relates to a digital camera comprising a smear removal function, more particularly to a digital camera which can change presence of smear removal or intensity of smear removal according to the smear generation state.

2. Description of the Related Art

For the past number of years, in image pickup devices such as a CCD, there has been a problem that a white line called smear is generated in the imaged image data due to entrance of intense light (for example, sunlight, car headlight and the like), leading to deteriorated image quality.

In order to solve such a problem, there have been digital cameras which remove smear by subtracting pixel signals in the vertical optical black region from pixel signals of pixels in the effective pixel region among pixel signals imaged by a CCD (for example, Japanese Laid-Open Patent Publication No. 2001-86413).

According to the traditional imaging apparatuses, image data with no smear can be obtained by subtracting pixel signals of pixels in the vertical optical black region from pixel signals of pixels in the effective pixel region.

However, in this case, there has been a problem that since the pixel signals of the pixels in the vertical optical black region are subtracted uniformly, deterioration of the signal-noise ratio or deterioration of image quality is caused in the case that smear is not generated intensely.

Further, in the case that smear is generated diagonally due to movement of the camera or an object, there has been a problem that deterioration of image quality is also caused when the pixel signals of the pixels in the vertical optical black region are uniformly subtracted.

SUMMARY OF THE INVENTION

In accordance with an aspect of the present invention, there is provided an imaging apparatus comprising an image pickup device having a horizontal optical black region and a vertical optical black region; a storage control means for storing pixel signals in the vertical optical black region among pixel signals outputted from the image pickup device in a storage means; a first calculation means for calculating a value of pixel signals in the horizontal optical black region based on pixel signals of one or more pixels in the horizontal optical black region among the pixel signals outputted from the image pickup device; a second calculation means for calculating a value of pixel signals in the vertical optical black region based on pixel signals of one or more pixels in the vertical optical black region among the pixel signals outputted from the image pickup device; a subtraction means for subtracting the pixel signal stored in the storage means from the pixel signal outputted from the image pickup device; and a subtraction control means for controlling the degree of subtraction by the subtraction means based on the difference between the value calculated by the first calculation means and the value calculated by the second calculation means.

In accordance with another aspect of the present invention, there is provided an imaging apparatus comprising an image pickup device having a vertical optical black region 1 and a vertical optical black region 2; a storage control-means for storing pixel signals in the vertical optical black region among pixel signals outputted from the image pickup device in a storage means; a calculation means for calculating a value of the difference between a pixel signal of a pixel in the vertical optical black region 1 and a pixel signal of a pixel in the vertical optical black region 1 for every column among the pixel-signals outputted from the image pickup device; a subtraction means for subtracting the pixel signal stored in the storage means from the pixel signal outputted from the image pickup device; and a subtraction control means for controlling whether or not subtraction by the subtraction means is performed based on the value calculated by the calculation means for every column.

BRIEF DESCRIPTION OF THE DRAWINGS

FIGS. 3A to 3C are views for explaining an outline of the present invention in a first embodiment;

DETAILED DESCRIPTION OF THE PREFERRED EMBODIMENTS

The present invention will hereinafter be described in detail with reference to the preferred embodiments shown in the accompanying drawings.

A. First Embodiment

A-1. Structure of the Digital Camera

Figure 1:
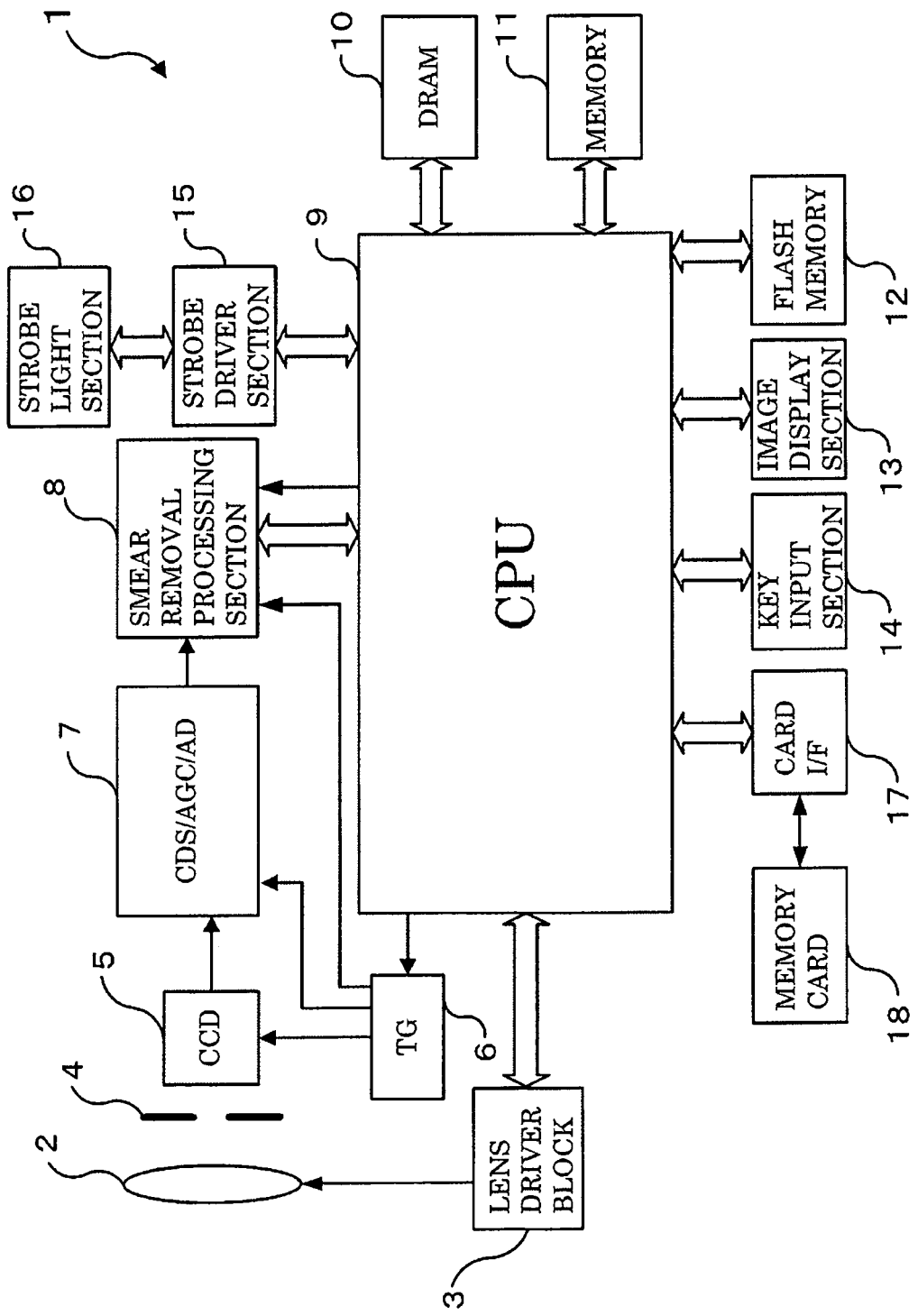
FIG. 1 is a block diagram of a digital camera 1 in an embodiment of the present invention.

FIG. 1 is a block diagram showing an electrical outline structure of a digital camera1 1 which realizes the imaging apparatus of the present invention.

The digital camera 1 comprises an image pickup lens 2, a lens driver block 3, an aperture/shutter combination 4, a CCD 5, a timing generator (TG) 6, a unit circuit 7, a smear removal processing section 8, a CPU 9, a DRAM 10, a memory 11, a flash memory 12, an image display section 13, a key input section 14, a strobe driver section 15, a strobe light section 16, and a card I/F 17. A memory card 18 removably inserted in an unshown card slot of the digital camera 1 main body is connected to the card I/F 17.

The image pickup lens 2 includes an unshown focus lens and an unshown zoom lens, and is connected to the lens driver block 3. The lens driver block 3 is composed of unshown motors for driving the focus lens and the zoom lens in the optical axis direction respectively, and a focus motor driver and a zoom motor driver for driving a focus motor and a zoom motor in the optical axis direction respectively according to control signals from the CPU 9.

The aperture/shutter combination 4 includes an unshown driver circuit which operates the aperture/shutter combination according to control signals sent from the CPU 9. The aperture/shutter combination functions as an aperture and a shutter.

The aperture is a mechanism to control the amount of light which enters through the image pickup lens 2. The shutter is a mechanism to control the time duration for applying light to the CCD 5. The time duration for applying light to the CCD 5 changes according to the opening and closing speed of the shutter (shutter speed). An exposure can be determined according to the aperture and the shutter speed.

The CCD 5 (image pickup device) converts the light of an object projected via the image pickup lens 2 and the aperture/shutter combination 4 into an electrical signal and outputs the signal to the unit circuit 7 as an imaging signal. In addition, the CCD 5 is driven according to a timing signal in a given frequency generated by the TG 6.

Figure 2:
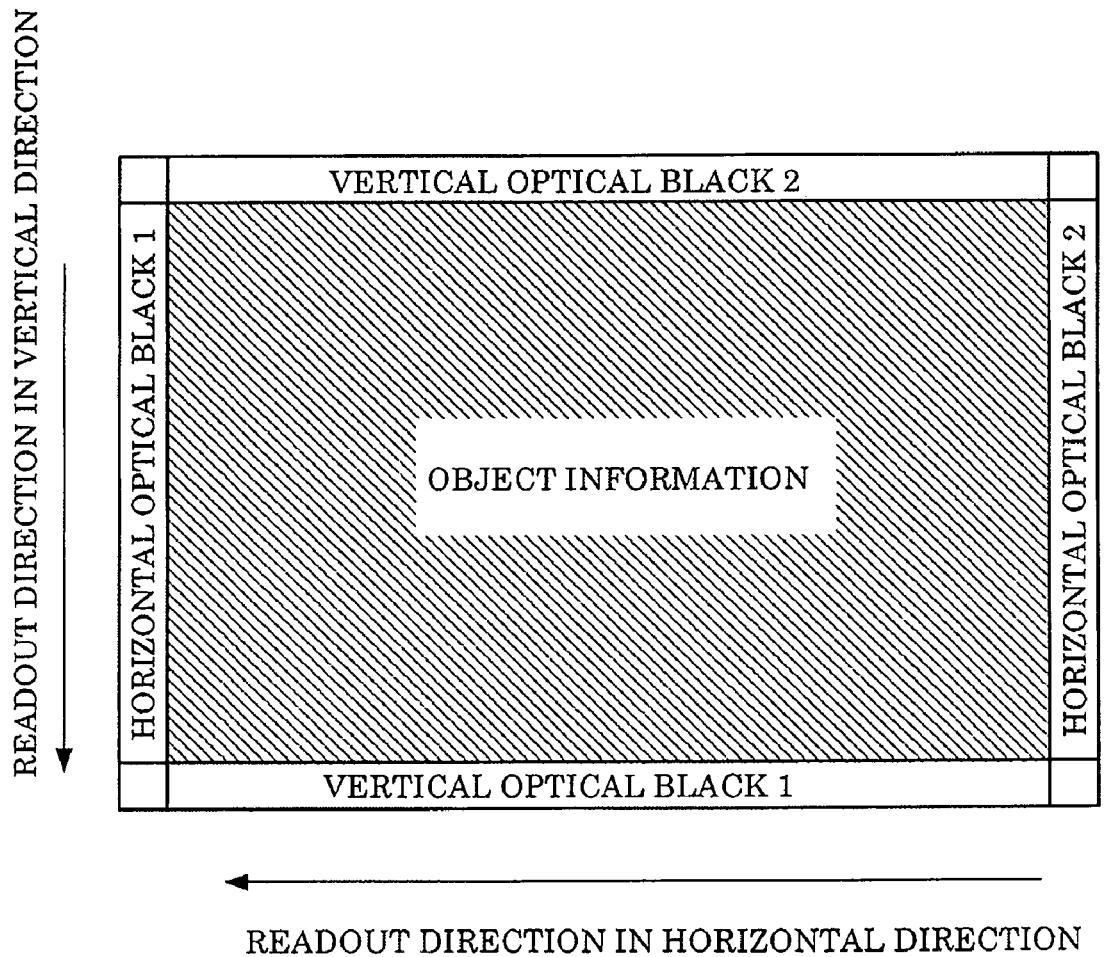
FIG. 2 is a view showing a horizontal optical black region and a vertical optical black region.

As shown in FIG. 2, the CCD 5 is composed of an effective pixel region for obtaining object information, a vertical optical black (vertical OB) region for determining the black reference in the vertical direction, and a horizontal optical black (horizontal OB) region for determining the black reference in the horizontal direction.

The optical black region is formed by attaching a light blocking film to upper, lower, right, and left hems of the CCD 5. That is, image signals corresponding to an inky-black image are obtained in the optical black region.

Here, the upper optical black of the CCD 5 is referred to as a vertical optical black 2, the lower optical black of the CCD 5 is referred to as a vertical optical black 1, the left optical black is referred to as a horizontal optical black 1, and the right optical black is referred to as a horizontal optical black 2.

The CCD 5 is an interline type CCD. Therefore, every line of pixel signals of pixels of the CCD 5 is read out from the lower line to the upper line of the CCD 5. That is, pixel signals in the vertical optical black region 1 are read out first, and pixel signals in the vertical optical black region 2 are read out last.

The unit circuit 7 is composed of a Correlated Double Sampling (CDS) circuit which performs and maintains correlated double sampling of the imaging signal outputted from the CCD 5, an Automatic Gain Control (AGC) circuit which performs automatic gain control of the imaging signal after sampling, and an A/D converter which converts the analog imaging signal after the automatic gain control into a digital signal. The imaging signal of the CCD 5 is sent to the smear removal processing section 8 as a digital signal via the unit circuit 7. The TG 6 is connected to the unit circuit 7.

The smear removal processing section 8 evaluates intensity of smear removal from the image data (digital signal) sent from the unit circuit 7. Then, the smear removal processing section 8 removes smear according to the evaluated intensity and outputs the result to the CPU 9. For the smear removal processing section 8, the characterizing portion of the present invention will be described in detail later. The TG 6 is connected to the smear removal processing section 8.

The CPU 9 is an one chip microcomputer which has functions of performing image processing of the image data sent from the unit circuit 7 (pixel interpolation processing, γ correction, luminosity color difference signal generation, white-balance processing, exposure correction processing and the like), performing processing compression/expansion of image data (for example, compression/expansion in JPEG format, M-JPEG format, or MPEG format), and performing output of information necessary for the smear removal processing section 8 (horizontal OB address information, vertical OB address information and the like) and the like; and which controls each section of the digital camera 1.

The DRAM 10 is used as a working memory for the CPU 9 while being used as a buffer memory to temporarily store the image data sent to the CPU 9 after being imaged by the CCD 5.

The flash memory 12 and the memory card 18 are recording media for storing image data or the like imaged by the CCD 5.

The image display section 13 includes a color LCD and its driver circuit. During a photography standby state, an object imaged by the CCD 5 is displayed as a through-image. At the time of reproducing the recorded image, the recorded image which is read out from the flash memory 12 or the memory card 18 for storage and expanded is displayed.

The key input section 14 includes a plurality of operation keys such as a shutter button, a mode key, an SET key, and a cross key. The manipulation signal corresponding to the user's keystroke operations is outputted to the CPU 9.

The strobe driver section 15 provides the flash drive of the strobe light section 16 according to a control signal from the CPU 9, and the strobe light section 16 performs the flash of light for the strobe. The CPU 9 judges whether or not a photographic scene is dark by an unshown photometry circuit. When the CPU 9 judges that a photographic scene is dark and judges that photography is to be performed (when the shutter button is depressed), the CPU 9 sends a control signal to the strobe driver section 15.

Programs necessary for controlling each section of the digital camera 1 by the CPU 9 and data necessary for controlling each section are recorded in the memory 11. The CPU 9 executes processes according to the programs.

A-2. Smear Removal Processing Section 8

Descriptions will be hereinafter given of the outline of the present invention in the first embodiment before description of the smear removal processing section 8.

As shown in FIG. 3A, when a high luminance object such as sunlight and car headlight is imaged by the CCD 5, a while line called smear is generated.

Further, a line of pixel data in the vertical optical black region is fundamentally the pixel data when a black object is imaged. However, when smear is generated, only the pixel data of the pixel in the section where smear is generated becomes a signal added with a smear signal as shown in FIG. 3B.

Further, since smear is generated in the vertical direction, smear is not added to pixel data in the horizontal optical black region. Therefore, pixel data of a column in the horizontal optical black region becomes the pixel data corresponding to that obtained when a black object is imaged as shown in FIG. 3C.

By utilizing the foregoing fact, in this embodiment, smear removal intensity is changed according to the difference between the average value of pixel data in lines in the vertical optical black region and the average value of pixel data in columns in the horizontal optical black region.

That is, when the difference between the average value of pixel data in lines in the vertical optical black region and the average value of pixel data in columns in the horizontal optical black region is small, the imaging apparatus of the present invention judges that smear is not generated intensely, and thus, the imaging apparatus controls that the smear removal intensity is decreased, or smear removal is not performed. Meanwhile, when the difference between the average values is large, the imaging apparatus judges that smear is generated intensely, and thus, the imaging apparatus controls that the smear removal intensity is increased.

Next, descriptions will be given of the smear removal processing section 8.

Figure 4:
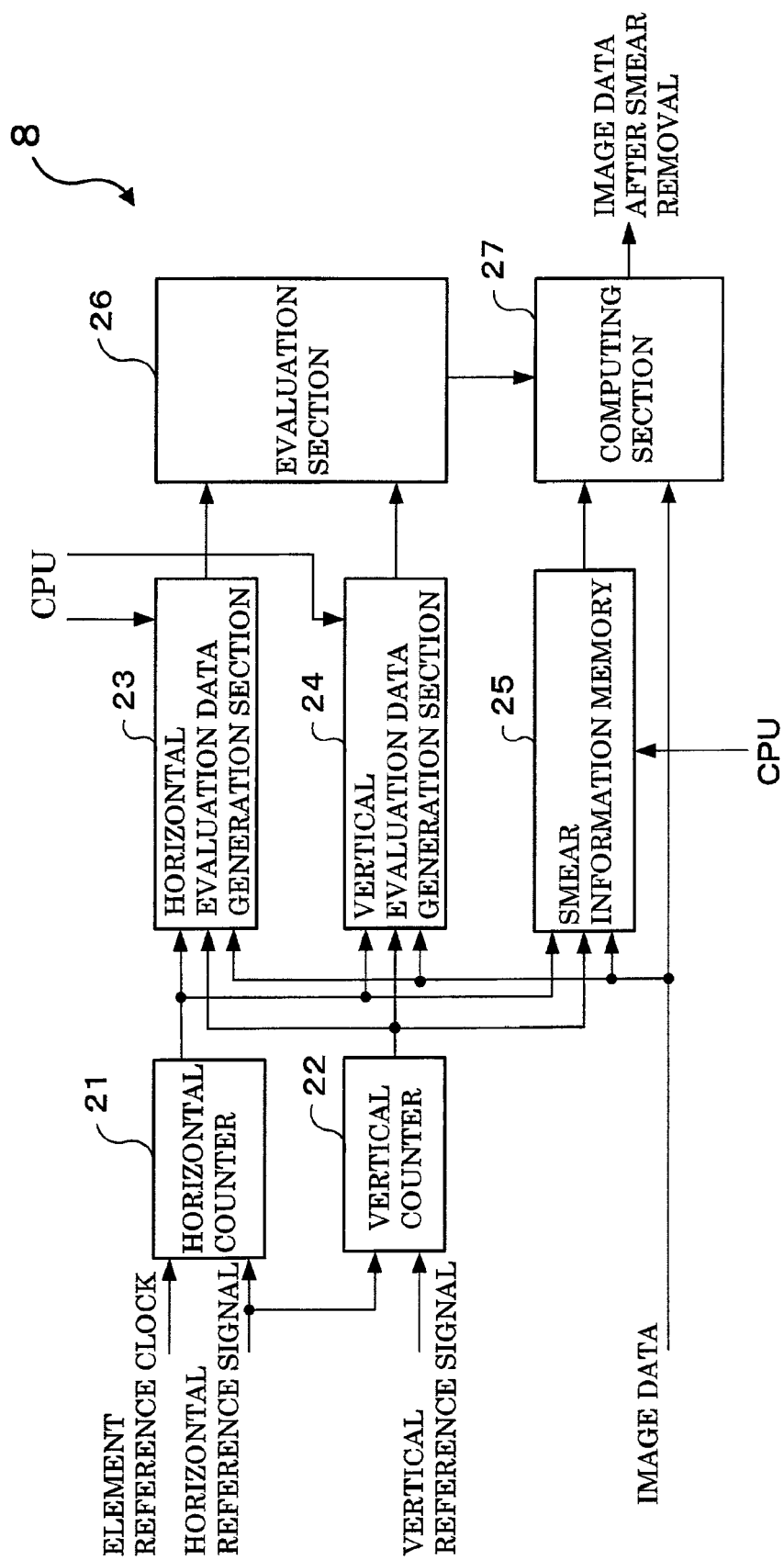
FIG. 4 is a block diagram showing an electrical outline structure of a smear removal processing section 8 in the first embodiment.

FIG. 4 is a block diagram showing an electrical outline structure of the smear removal processing section 8.

The smear removal processing section 8 is composed of a horizontal counter 21, a vertical counter 22, a horizontal evaluation data generation section 23, a vertical evaluation data generation section 24, a smear information memory 25, an evaluation section 26, and a computing section 27.

The horizontal counter 21 counts pixel reference clocks sent from the TG 6, and successively outputs the counted number to the horizontal evaluation data generation section 23 and the vertical evaluation data generation section 24. Thereby, the number of pixels inputted in the smear removal processing section 8 can be counted. The pixel reference clocks mean reference clocks for sampling image information, that is, reference clocks synchronizing the pixel data outputted from the CCD 5.

When a horizontal reference signal is sent from the TG 6, the horizontal counter 21 resets the counted number. Thereby, the number of pixels for every line can be counted. The horizontal reference signal means a reference signal generated once for every line, and is also called a horizontal blanking signal.

The vertical counter 22 counts horizontal reference signals sent from the TG 6, and successively outputs the counted number to the horizontal evaluation data generation section 23 and the vertical evaluation data generation section 24. Thereby, the number of lines can be counted.

When a vertical reference signal is sent from the TG 6, the vertical counter 22 resets the counted number. Thereby, the number of lines for every frame can be counted. Here, the vertical reference signal means a reference signal generated once for every frame, and is also called a vertical blanking signal.

Positions of pixels of the pixel data inputted to the smear removal processing section 8 can be recognized by the horizontal counter 21 and the vertical counter 22.

The number counted by the horizontal counter 21, the number counted by the vertical counter 22, and the pixel data sent from the unit circuit 7 are sequentially inputted to the horizontal evaluation data generation section 23. Further, horizontal OB address information outputted from the CPU 9 is also inputted to the horizontal evaluation data generation section 23. The horizontal OB address is defined as information indicating a given pixel to be sampled. The pixel to be sampled is a pixel in the horizontal optical black region. When there is a plurality of pixels to be sampled, the pixels to be sampled are located in the same column.

The horizontal evaluation data generation section 23 identifies the pixel data sent from the unit circuit 7 (finds what line and what column the pixel of the pixel data is located) by the numbers inputted from the horizontal counter 21 and the vertical counter 22. The horizontal evaluation data generation section 23 judges whether or not the inputted pixel data is the pixel data corresponding to the horizontal OB address information sent from the CPU 9.

When the horizontal evaluation data generation section 23 judges that the inputted pixel data is the pixel data corresponding to the horizontal OB address information, the pixel data is integrated, and the integrated pixel data is stored in a horizontal OB integration register located in the horizontal evaluation data generation section 23.

When the count by the vertical counter 22 is reset by the vertical reference signal, that is, when the output from the vertical counter 22 becomes 0, the horizontal evaluation data generation section 23 resets (deletes) the storage in the horizontal OB integration register.

Further, the horizontal evaluation data generation section 23 judges whether or not all the pixel data corresponding to the horizontal OB address information sent from the CPU 9 have been integrated respectively and the integrated pixel data has been stored in the horizontal OB integration register.

When the horizontal evaluation data generation section 23 judges that all the pixel data corresponding to the horizontal OB address information sent from the CPU 9 have been integrated respectively and the integrated pixel data has been stored in the horizontal OB integration register, the horizontal evaluation data generation section 23 calculates an average value $HOB_{avr}$ from all the integrated pixel data which has been stored in the horizontal OB integration register. The average value $HOB_{avr}$ can be obtained by adding all the integrated pixel data, and dividing the added value by the number of the added pixels.

After the horizontal evaluation data generation section 23 calculates the average value, the horizontal evaluation data generation section 23 outputs the calculated value to the evaluation section 26.

The number counted by the horizontal counter 21, the number counted by the vertical counter 22, and the pixel data sent from the unit circuit 7 are sequentially inputted to the vertical evaluation data generation section 24. Further, vertical OB address information outputted from the CPU 9 is also inputted to the vertical evaluation data generation section 24. The vertical OB address information is defined as information indicating a given pixel to be sampled. The pixel to be sampled is a pixel in the vertical optical black region. When there is a plurality of pixels to be sampled, the pixels to be sampled are the pixels located in the same line.

The vertical evaluation data generation section 24 identifies the pixel data sent from the unit circuit 7 (finds what line and what column the pixel of the pixel data is located) from the numbers inputted from the horizontal counter 21 and the vertical counter 22. The vertical evaluation data generation section 24 judges whether or not the inputted pixel data is the pixel data corresponding to the vertical OB address information sent from the CPU 9.

When the vertical evaluation data generation section 24 judges that the inputted pixel data is the pixel data corresponding to the vertical OB address information, the pixel data is integrated, and the integrated pixel data is stored in a vertical OB integration register located in the vertical evaluation data generation section 24.

When the count by the vertical counter 22 is reset by the vertical reference signal, that is, when the output from the vertical counter 22 becomes 0, the vertical-evaluation data generation section 24 resets (deletes) the storage in the vertical OB integration register.

Further, the vertical evaluation data generation section 24 judges whether or not all the pixel data corresponding to the vertical OB address information sent from the CPU 9 have been integrated respectively and the integrated pixel data has been stored in the vertical OB integration register.

When the vertical evaluation data generation section 24 judges that all the pixel data corresponding to the vertical OB address information sent from the CPU 9 have been integrated respectively and the integrated pixel data has been stored in the vertical OB integration register, the vertical evaluation data generation section 24 calculates an average value $VOB_{avr}$ from all the integrated pixel data which is stored in the vertical OB integration register. The average value $VOB_{avr}$ can be obtained by adding all the integrated pixel data, and dividing the added value by the number of the added pixels.

After the vertical evaluation data generation section 24 calculates the average value, the vertical evaluation data generation section 24 outputs the calculated value to the evaluation section 26.

Figure 5:
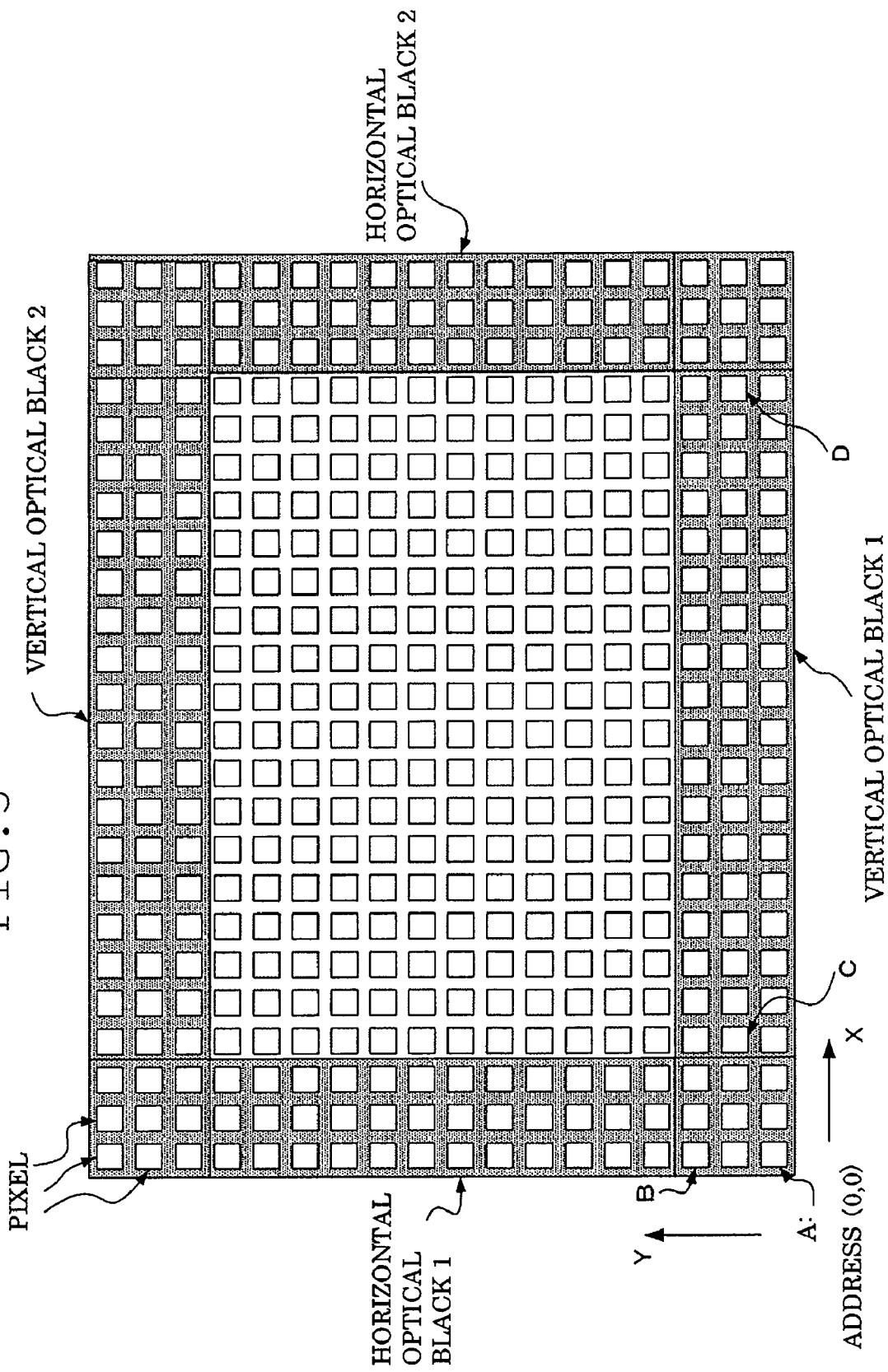
FIG. 5 is a view showing an outline of a structure of a CCD 5.

FIG. 5 is a view showing an outline of the structure of the CCD 5.

From FIG. 5, it is found that the CCD 5 is composed of a plurality of pixels. A netted section of the CCD 5 represents the optical black region.

Further, the lower hem vertical optical black region of the CCD 5 is referred to as a vertical optical black region 1, the upper hem vertical optical black region of the CCD 5 is referred to as a vertical optical black region 2. The left hem horizontal optical black region of the CCD 5 is referred to as a horizontal optical black region 1, and the right hem horizontal optical black region of the CCD 5 is referred to as a horizontal optical black region 2. That is, of the vertical optical black region, the vertical optical black region having a pixel group whose pixel signals are read out first becomes the vertical optical black region 1, and the vertical optical black region having pixels whose pixel signals are readout later becomes the vertical optical black region 2.

Here, where a pixel address of a pixel A in the bottom left corner is (0, 0), the horizontal direction is X axis, and the vertical direction is Y axis, an address of a pixel B (x, y) becomes (0, 2), an address of a pixel C (x, y) becomes (3, 1), and an address of a pixel D (x, y) becomes (20, 1). x represents a column, and y represents a line.

For example, when information of pixel address (x, y)=(0, to 2) is sent from the CPU 9 to the horizontal evaluation data generation section 23 as horizontal OB address information, the horizontal evaluation data generation section 23 judges whether or not the pixel data sent from the unit circuit 7 is the pixel data corresponding to the horizontal OB address information, that is, pixel data of the pixels with the pixel addresses (0, 0), (0, 1), and (0, 2). When the horizontal evaluation data generation section 23 judges that the pixel data sent from the unit circuit 7 is the pixel data of the pixels corresponding to the horizontal OB address information, the pixel data is integrated and stored in the horizontal OB integration register.

Further, when information of pixel address (x, y)=(3 to 20, 1) is sent from the CPU 9 to the vertical evaluation data generation section 24 as vertical OB address information, the vertical evaluation data generation section 24 judges whether or not the pixel data sent from the unit circuit 7 is the pixel data corresponding to the vertical OB address information, that is, pixel data with the pixel addresses (3, 1), (4, 1) ... (19, 1), and (20, 1). When the vertical evaluation data generation section 24 judges that the pixel data sent from the unit circuit 7 is the pixel data of the pixels corresponding to the vertical OB address information, the pixel data are integrated and stored in the vertical OB integration register.

Here, the pixel data outputted from the CCD 5 is outputted for every line such as pixel data in the zeroth line, pixel data in the first line, and pixel data in the second line. Therefore, the pixel data of the pixels corresponding to the vertical OB address information is sequentially inputted to the vertical evaluation data generation section 24. Meanwhile, the pixel data of the pixels corresponding to the horizontal OB address information is inputted to the horizontal evaluation data generation section 23 at intervals of line.

It is needless to say that the horizontal OB address information and the vertical OB address information sent from the CPU 9 is information indicating addresses of pixels located in the optical black region.

The evaluation section 26 has an average value storage region H and an average value storage region V. The average value $HOB_{avr}$ outputted from the horizontal evaluation data generation section 23 is stored in the average value storage region H, and the average value $VOB_{avr}$ outputted from the vertical evaluation data generation section 24 is stored in the average value storage region V.

After the average values are stored in the average value storage region H and the average value storage region V respectively, the evaluation section 26 obtains the absolute value of the difference between $HOB_{avr}$ stored in the average value storage region H and the average value $VOB_{avr}$ stored in the average value storage region V, and outputs a gain value corresponding to the difference to the operating section 27.

Figure 6:
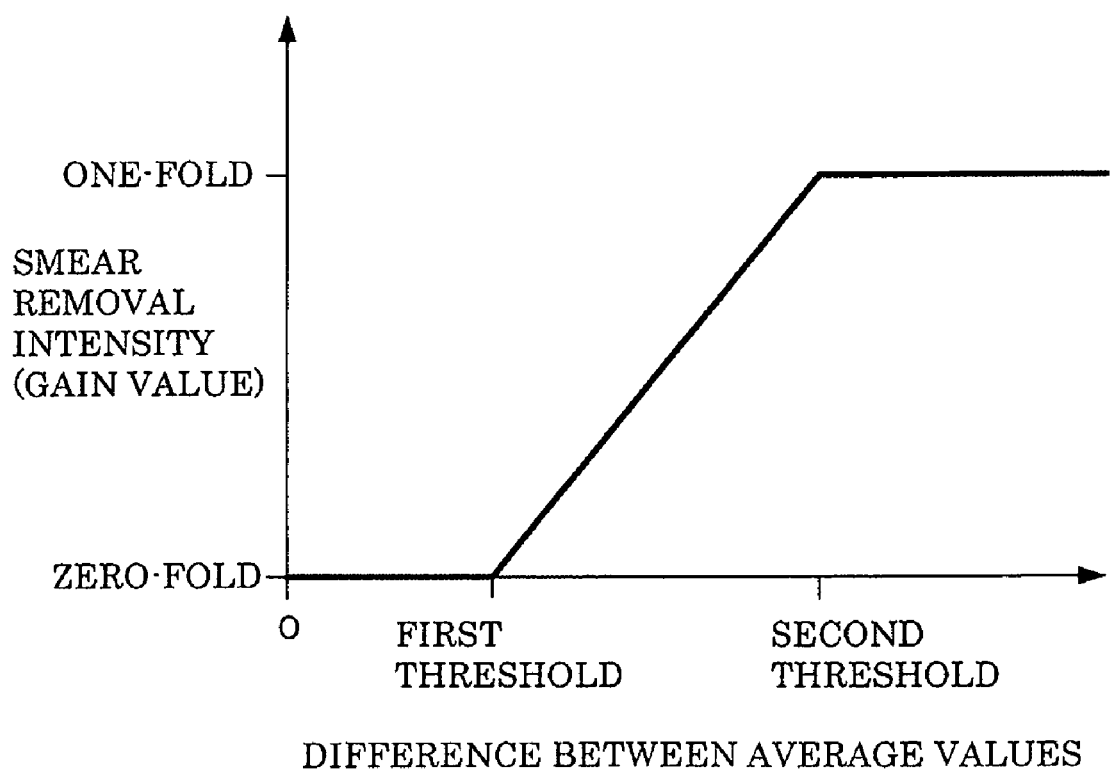
FIG. 6 is a view showing gain values according to the difference between average values outputted from an evaluation section 26.

For the gain value corresponding to the difference of the average values, as shown in FIG. 6, when the absolute value of the difference of the average values is lower than a first threshold, the gain value to be outputted is zero-fold, and when the absolute value of the difference of the average values is higher than a second threshold, the gain value to be outputted is one-fold. In addition, when the absolute value of the difference of the average values is higher than the first threshold and lower than the second threshold, the gain value to be outputted is obtained by a relational expression of gain value=(the absolute value of the difference of the average values−the first threshold)/(the second threshold−the first threshold), and the result is outputted to the computing section 27.

After the gain value is outputted to the computing section 27, the evaluation section 26 deletes the storage in the average value storage region H and the average value storage region V, and average values newly sent from the horizontal evaluation data generation section 23 and the vertical evaluation data generation section 24 are stored.

The number counted by the horizontal counter 21, the number counted by the vertical counter 22, and the pixel data sent from the unit circuit 7 are inputted to the smear information memory 25. Further, smear address information outputted from the CPU 9 is also inputted to the smear information memory 25. The smear address information means information indicating the range of pixels used as smear information. The range of pixels means information indicating a line in the vertical optical black region.

The smear information memory 25 identifies the pixel data sent from the unit circuit 7 (finds what line and what column the pixel of the pixel data is located) from the numbers inputted from the horizontal counter 21 and the vertical counter 22. The smear information memory 25 judges whether or not the inputted pixel data is the pixel data corresponding to the smear address information sent from the CPU 9.

When the smear information memory 25 judges that the inputted pixel data is the pixel data corresponding to the smear address information, the pixel data is stored.

For example, when information of the first line, that is, information of pixel addresses (0 to 23, 1) is sent from the CPU 9 as smear address information (refer to FIG. 5), the smear information memory 25 judges whether or not the pixel data sent from the unit circuit 7 is the pixel data corresponding to the smear address information, that is, the pixel data of the pixels with the pixel addresses (0, 1), (1, 1) ... (22, 1), and (23, 1). When the smear information memory 25 judges that the pixel data sent from the unit circuit 7 is the pixel data of the pixels corresponding to the smear address information, the pixel data is stored.

Here, since the pixel data outputted from the CCD 5 is outputted for every line, the pixel data of the pixels corresponding to the smear address information is sequentially inputted to the smear information memory 25.

The computing section 27 stores the gain value sent from the evaluation section 26 in a storage region located in the computing section 27. When a new gain value is sent from the evaluation section 26, the computing section 27 overwrites the precedent gain value with the new gain value, and stores the new gain value.

The pixel data is inputted from the unit circuit 7 to the computing section 27.

When pixel data of a pixel in the effective pixel region is inputted from the unit circuit 7, the computing section 27 reads out pixel data in the same column as of the pixel of the inputted pixel data from the smear information memory 25, and multiplies the readout pixel data by the gain value stored in the storage region. Then, the computing section 27 subtracts the pixel data after the multiplication from the pixel data of the pixel in the effective pixel region sent from the unit circuit 7, and outputs the result to the CPU 9. That is, where if the pixel data of the pixel in the effective pixel region sent from the unit circuit 7 is Pr, the pixel data stored in the smear information memory 25 is Ps, and the gain value is Ph, there may be realized, and thus, a relational formula expression of P=Pr−Ps×Ph can be established for the pixel data outputted from the computing section 27, P. Thereby, only the smear element can be removed from the pixel data imaged by the CCD 5.

For example, when the pixel data in the fifth column Pr sent from the unit circuit 7 is inputted to the computing section 27, the pixel data Ps in the fifth column is read out from the pixel data stored in the smear information memory 25, the readout result is multiplied by the gain value Ph, and the pixel data after the multiplication (Ps×Ph) is subtracted from the pixel data in the fifth column sent from the unit circuit 7. Similarly, when the pixel data Pr in the sixth column is inputted to the computing section 27, the pixel data Ps in the sixth column is read out from the pixel data stored in the smear information memory 25, the readout result is multiplied by the gain value Ph, and the pixel data after the multiplication (Ps×Ph) is subtracted from the pixel data in the sixth column sent from the unit circuit 7. That is, subtraction is performed for the pixels in the same column.

Thereby, by changing the gain value according to the difference between the average value $HOB_{avr}$ of the pixel data sampled in the horizontal optical black region and the average value $VOB_{avr}$ of the pixel data sampled in the vertical optical black region, presence of smear removal and intensity of the smear removal are changed.

In the case that a gain value has not yet been stored in the storage region when pixel data of a pixel in the effective pixel region is input, the computing section 27 directly outputs the inputted pixel data without removing smear.

A-3. Operation of the Smear Removal Processing Section 8

Figure 7:
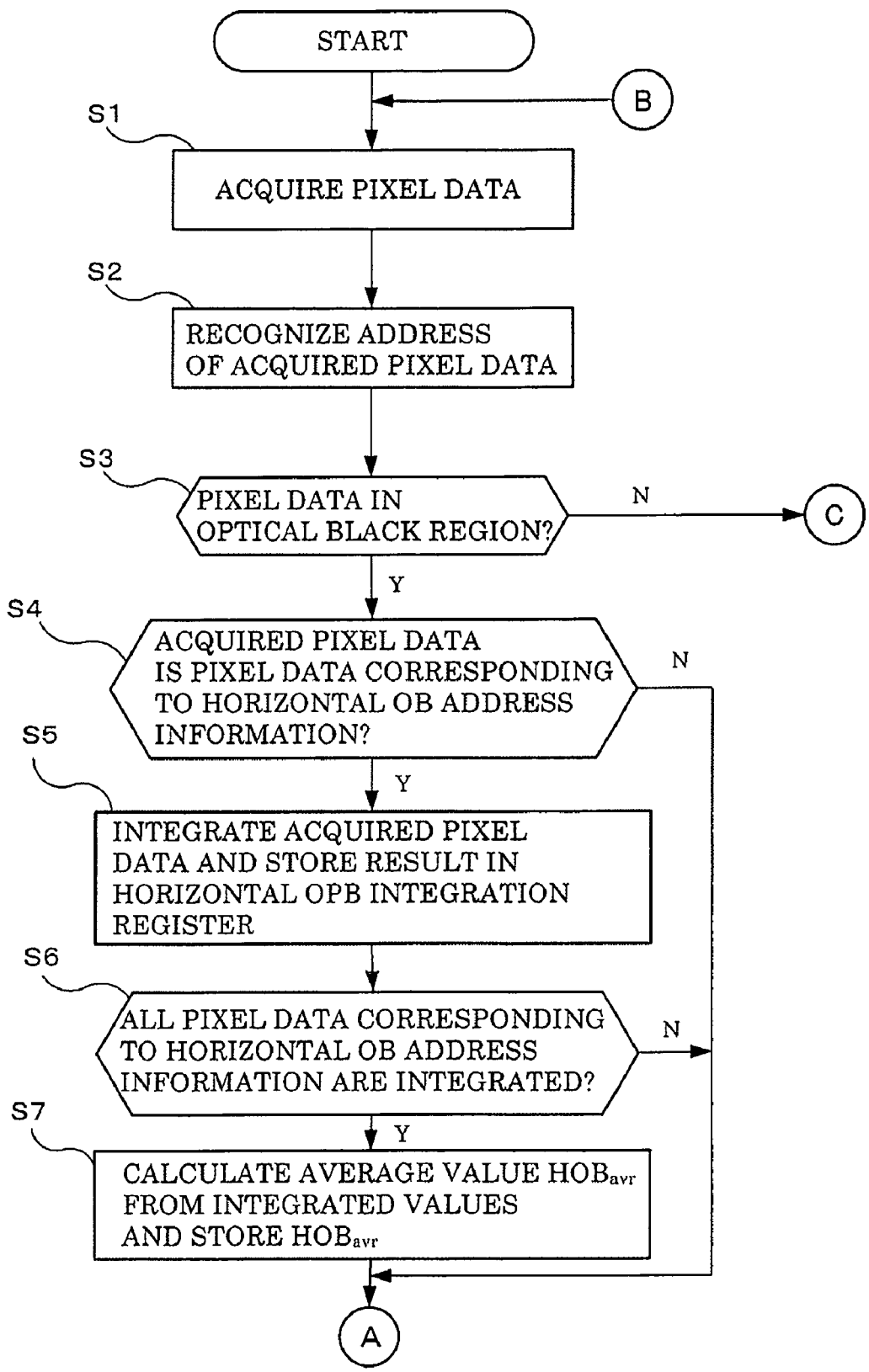
FIG. 7 is a flowchart showing operation of a digital camera in the first embodiment.
Figure 8:
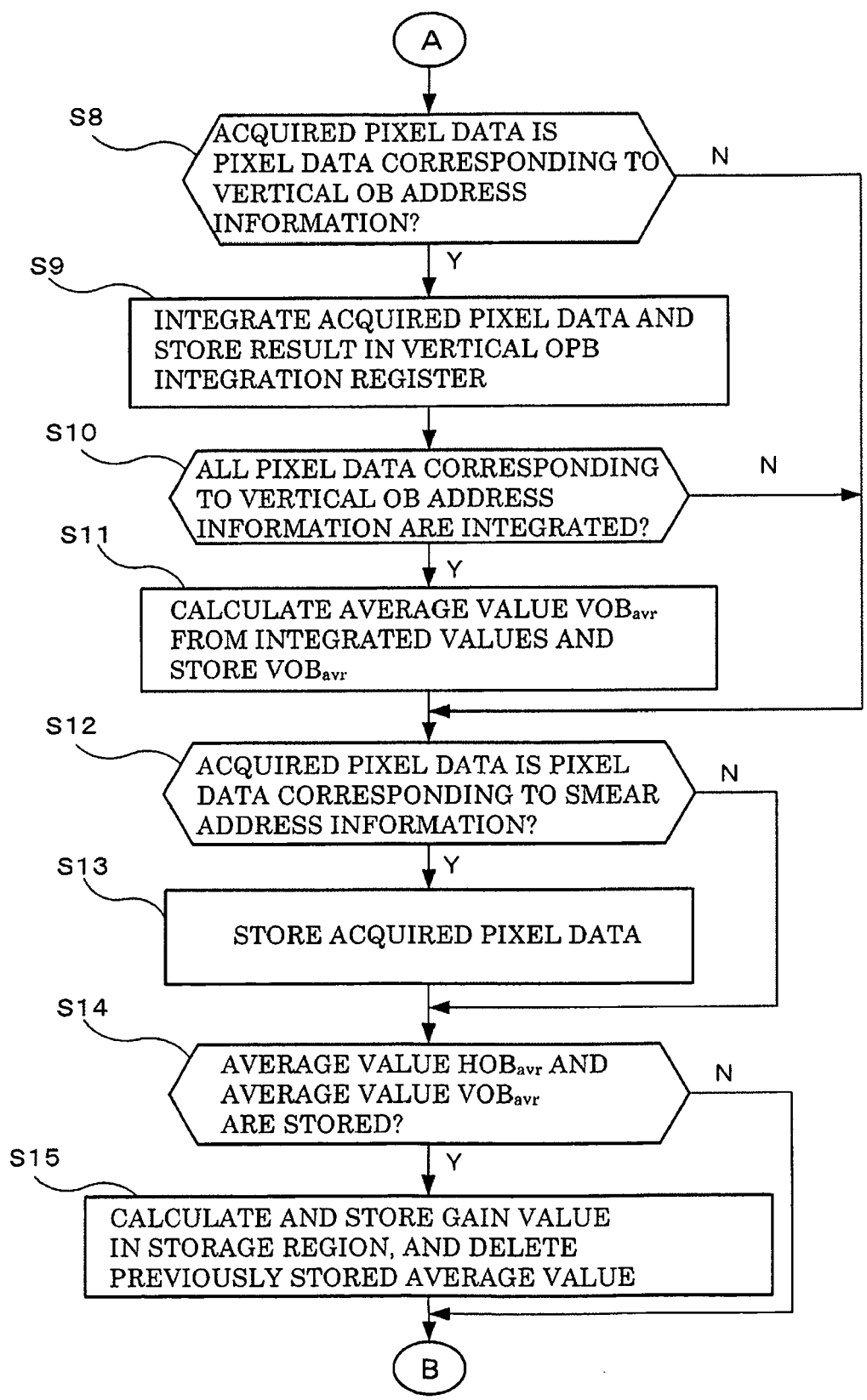
FIG. 8 is a flowchart showing operation of the digital camera in the first embodiment.

Operation of the smear removal processing section 8 in the first embodiment will be hereinafter described according to flowcharts of FIG. 7 to FIG. 9.

First, in Step S1, the smear information processing section 8 acquires pixel data imaged by and outputted from the CCD 5 via the unit circuit 7. Here, the CCD 5 outputs accumulated charge (pixel data) for every line according to the timing signal of the TG 6. Then, the pixels of the pixel data outputted for every line are outputted in a sequential order from the zeroth column.

Next, in Step S2, a pixel address of the acquired pixel data is recognized. The pixel address of the acquired pixel data can be recognized based on the numbers counted by the horizontal counter 21 and the vertical counter 22. Thereby, to what line and to what column the pixel of the acquired pixel data belongs can be recognized.

Next, in Step S3, whether or not the acquired pixel data is pixel data in the optical black region is judged based on the recognized pixel address.

When judged that the acquired pixel data is pixel data in the optical black region in Step S3, the flow proceeds to Step S4. In Step S4, whether or not the acquired pixel data is the pixel data corresponding to the horizontal OB address information sent from the CPU 9 is judged.

When judged that the acquired pixel data is the pixel data corresponding to the horizontal OB address information in Step S4, the flow proceeds to Step S5. In Step S5, the acquired pixel data is integrated, and the integrated pixel data is stored in the horizontal OB integration register.

Next, in Step S6, whether or not all the pixel data corresponding to the horizontal OB address information have been integrated is judged.

When judged that all the pixel data corresponding to the horizontal OB address information have been integrated in Step S6, the average value $HOB_{avr}$ is calculated from all the integrated pixel data stored in the horizontal OB integration register, the average value $HOB_{avr}$ is outputted to the evaluation section 26, and the evaluation section 26 stores the sent average value $HOB_{avr}$ in the average value storage region H in Step S7. The flow proceeds to step S8 of FIG. 8.

Meanwhile, when judged that the acquired pixel data is not the pixel data corresponding to the horizontal OB address information in Step S4, or when judged that the pixel data corresponding to the horizontal OB address information has not been all integrated in Step S6, the flow directly proceeds to Step S8.

In Step S8, whether or not the acquired pixel data is the pixel data corresponding to the vertical OB address information sent from the CPU 9 is judged.

When judged that the acquired pixel data is the pixel data corresponding to the vertical OB address information in Step S8, the acquired pixel data is integrated and the integrated pixel data is stored in the vertical OB integration register in Step S9.

Next, in Step S10, whether or not all the pixel data corresponding to the vertical OB register are integrated is judged.

When judged that all the pixel data corresponding to the vertical OB address information have been integrated in Step S10, the flow proceeds to Step S11. In step S1, the average value $VOB_{avr}$ is calculated from all the integrated pixel data stored in the vertical OB integration register, the average value $VOB_{avr}$ is outputted to the evaluation section 26, and the evaluation section 26 stores the sent average value $VOB_{avr}$ in the average value storage region V. The flow proceeds to Step S12.

Meanwhile, when judged that the acquired pixel data is not the pixel data corresponding to the vertical OB address information in Step S8, or when judged that the pixel data corresponding to the vertical OB register has not been all integrated in Step S10, the flow directly proceeds to Step S12.

In Step S12, whether or not the acquired pixel data is the pixel data corresponding to the smear address information sent from the CPU 9 is judged.

When judged that the acquired pixel data is the pixel data corresponding to the smear address information in Step S12, the flow proceeds to Step S13. In Step S13, the acquired pixel data is stored in the smear information memory 25. Then, the flow proceeds to Step S14.

Meanwhile, when judged that the acquired pixel data is not the pixel data corresponding to the smear information memory 25 in Step S12, the flow directly proceeds to Step S14.

In Step S14, whether or not the average value $HOB_{avr}$ and the average value $VOB_{avr}$ have been stored in the average value storage region H and the average value storage region V of the evaluation section 26 is judged.

When judged that the average value $HOB_{avr}$ and the average value $VOB_{avr}$ have been stored in Step S14, the evaluation section 26 calculates a gain value based on the two stored average values, and outputs the calculated gain value to the computing section 27 in Step S15. In addition, in Step S15, the evaluation section 26 deletes the storage in the average value storage region H and the average value storage region V, and the computing section 27 stores the gain value sent from the evaluation section 26 in the storage region, and the flow is returned to Step S1. Then, when a gain value has been already stored in the storage region, the precedent gain value is overwritten with the gain value newly sent from the evaluation section 26, and the new gain value is stored.

Thus, since the gain value is calculated based on the average value $HOB_{avr}$ and the average value $VOB_{avr}$, presence of smear removal and intensity of smear removal effect can be changed according to the smear generation state.

Meanwhile, when judged that the average value $HOB_{avr}$ and the average value $VOB_{avr}$ have not been stored in Step S14, the flow is directly returned to Step S1.

Figure 9:
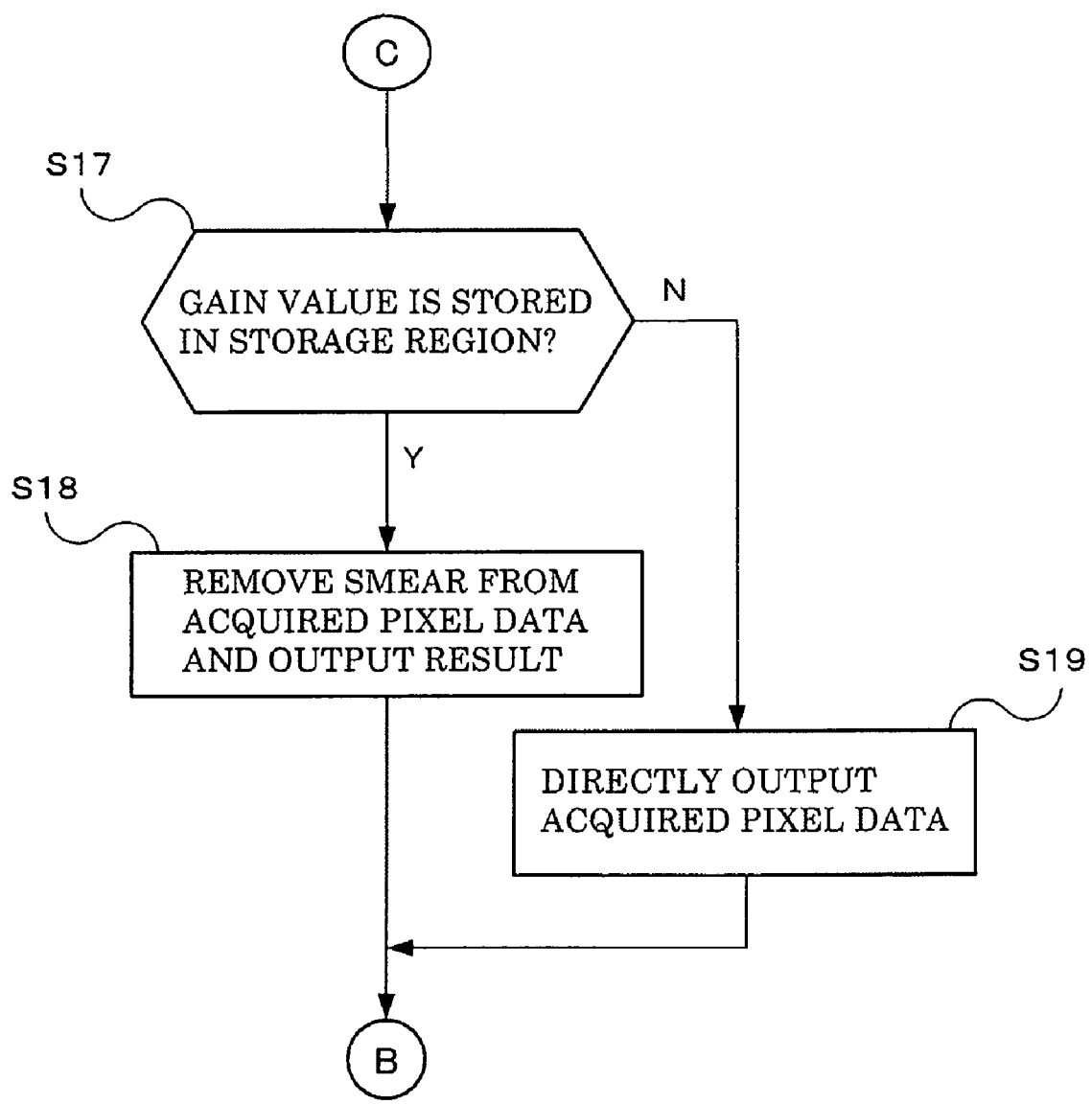
FIG. 9 is a flowchart showing operation of the digital camera in the first embodiment.

Meanwhile, when judged that the acquired pixel data is not the pixel data in the optical black region in Step S3, the acquired pixel data is judged to be pixel data in the effective pixel region, and the flow proceeds to Step S17 of FIG. 9. In Step S17, whether or not the gain value has been stored in the storage region is judged.

When judged that the gain value has been stored in Step S17, the flow proceeds to Step S18. In step S18, a smear element is removed from the acquired pixel data, the result is outputted to the CPU 9, and the flow is returned to Step S1. The smear element is removed by reading out pixel data which is in the same column as of the acquired pixel data from the smear information memory 25, multiplying the readout pixel data by the stored gain value, and subtracting the pixel data after the multiplication from the acquired pixel data. Then, when the stored gain value is 0, smear is not removed accordingly.

Meanwhile, when judged that a gain value has not been stored in Step S17, the flow proceeds to Step S19. In Step S19, the pixel data acquired in Step S1 is directly outputted to the CPU 9, and the flow is returned to Step S1.

A-4. Operational Effect

As above, in the first embodiment, the average value $HOB_{avr}$ of the pixel data in the horizontal optical black region and the average value $VOB_{avr}$ of the pixel data in the vertical optical black region are calculated, and intensity of smear removal effect is changed (gain value is changed) according to the difference between the calculated average value $HOB_{avr}$ and the calculated average value $VOB_{avr}$. Therefore, deterioration of the S/N ratio and deterioration of the image quality which are associated with smear removal can be prevented.

That is, when smear removal is not much necessary (when smear is not generated intensely), the difference between the average value $HOB_{avr}$ and the average value $VOB_{avr}$ becomes small, the gain value outputted from the evaluation section 26 becomes small, and the intensity of smear removal effect becomes weak. On the other hand, when smear removal is necessary (when smear is generated intensely), the difference between the average value $HOB_{avr}$ and the average value $VOB_{avr}$ becomes large, the gain value outputted from the evaluation section 26 becomes large, and the intensity of smear removal effect becomes strong. In particular, when the difference between the average value $HOB_{avr}$ and the average value $VOB_{avr}$ is smaller than a given threshold, the intensity of smear removal effect becomes 0, that is, smear removal is not performed. Thereby, the phenomenon that removing insignificant smear generated in one section produces the opposite effect of the S/N ratio deterioration of the whole image can be prevented.

In the first embodiment, the line of the pixel data stored in the smear information memory 27 may be identical with the line of the pixel data to be sampled by the vertical evaluation data generation section 24. For example, when pixels in the first line (pixel addresses (0, 1) . . . and (23, 1)) are sent to the smear information memory 25 as smear address information, the range of the pixels to be sampled which are sent to the vertical evaluation data generation section 24 as vertical OB address information (pixel addresses (3, 1) . . . and (20, 1)) are all in the first line. That is, the pixels to be sampled by the vertical evaluation data generation section 24 are the pixel data in the first line.

Further, while two thresholds, the first threshold and the second threshold are provided in the foregoing embodiment, however it is not limited to the above-mentioned style, the present invention includes the case where only one threshold is provided. In this case, when the difference between the average values is lower than the threshold, the gain value to be outputted may be 0 (that is, smear removal is not performed); and when the difference between the average values is higher than the threshold, the gain value to be outputted may be 1 (smear removal is performed).

B. Second Embodiment

Next, descriptions will be hereinafter given of a second embodiment.

In the second embodiment, though the digital camera 1 having the structure similar to the structure shown in FIG. 1 is used, the structure of the smear removal processing section 8 is slightly different.

B-1. Smear Removal Processing Section 8

Here, descriptions will be given of the outline of the present invention in the second embodiment before description of the smear removal processing section 8 in the second embodiment.

Figures 10A, 10B, 10C:
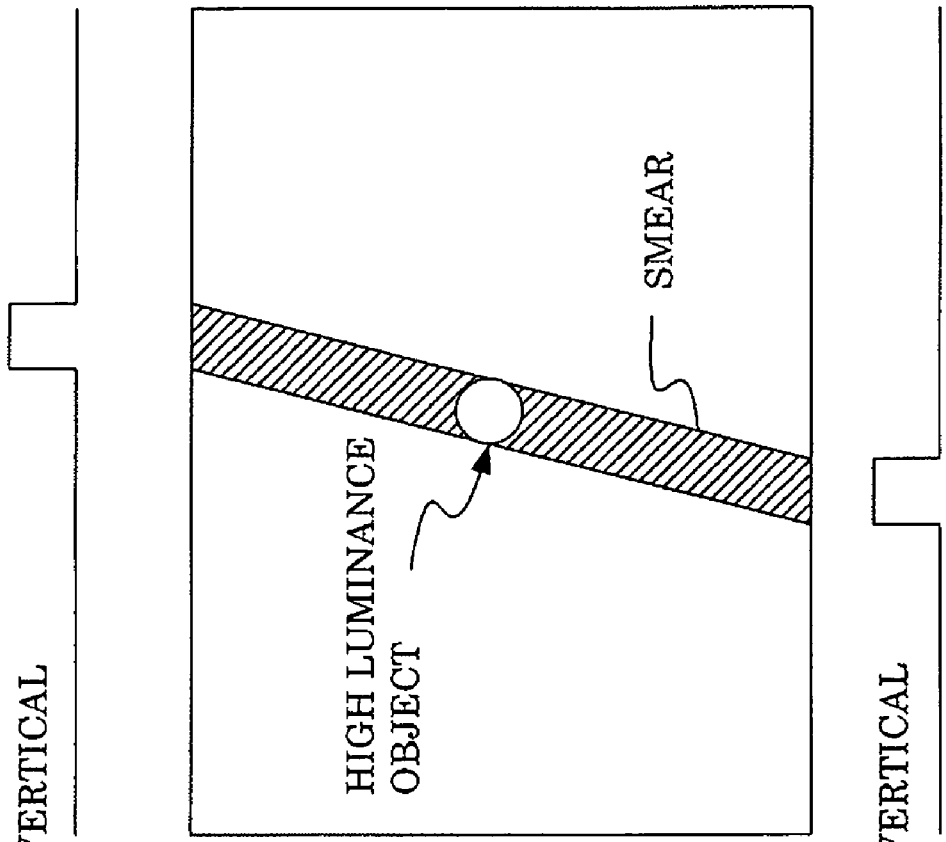
FIGS. 10A to 10C are views for explaining an outline of the present invention in a second embodiment.

As shown in FIG. 10A, when a camera is turned laterally in the middle of imaging a high luminance object such as sunlight or car headlight by the CCD 5, smear is diagonally generated.

In this case, the position of a pixel where smear is generated in the vertical optical black region 1 does not vertically correspond with but is deviated laterally from the position of a pixel where smear is generated in the vertical optical black region 2.

FIG. 10B shows a state of pixel signals in a line in the vertical optical black region 1. FIG. 10C shows a state of pixel signals in a line in the vertical optical black region 2.

It is found that though the pixel signals of the both lines in FIGS. 10B and 10C include a section added with a smear signal, the position where the smear signal is added is different from each other.

By utilizing the foregoing fact, in the second embodiment, the difference between the pixel data in the vertical optical black region 1 and the pixel data in the vertical optical black region 2 is obtained for every column, and smear removal intensity is changed according to the average value of the differences.

That is, when the average value of the differences for every column between the pixel data in the vertical optical black region 1 and the pixel data in the vertical optical black region 2 is small, smear is generated generally in the vertical direction. In this case, the smear removal intensity is increased. Meanwhile, when the average value of the differences for every column between the pixel data in the vertical optical black region 1 and the pixel data in the vertical optical black region 2 is large, smear is generated in the diagonal direction. In this case, the smear removal intensity is decreased, or smear removal is not performed. Performing smear removal when smear is diagonally generated produces the opposite effect that the image quality is deteriorated.

Figure 11:
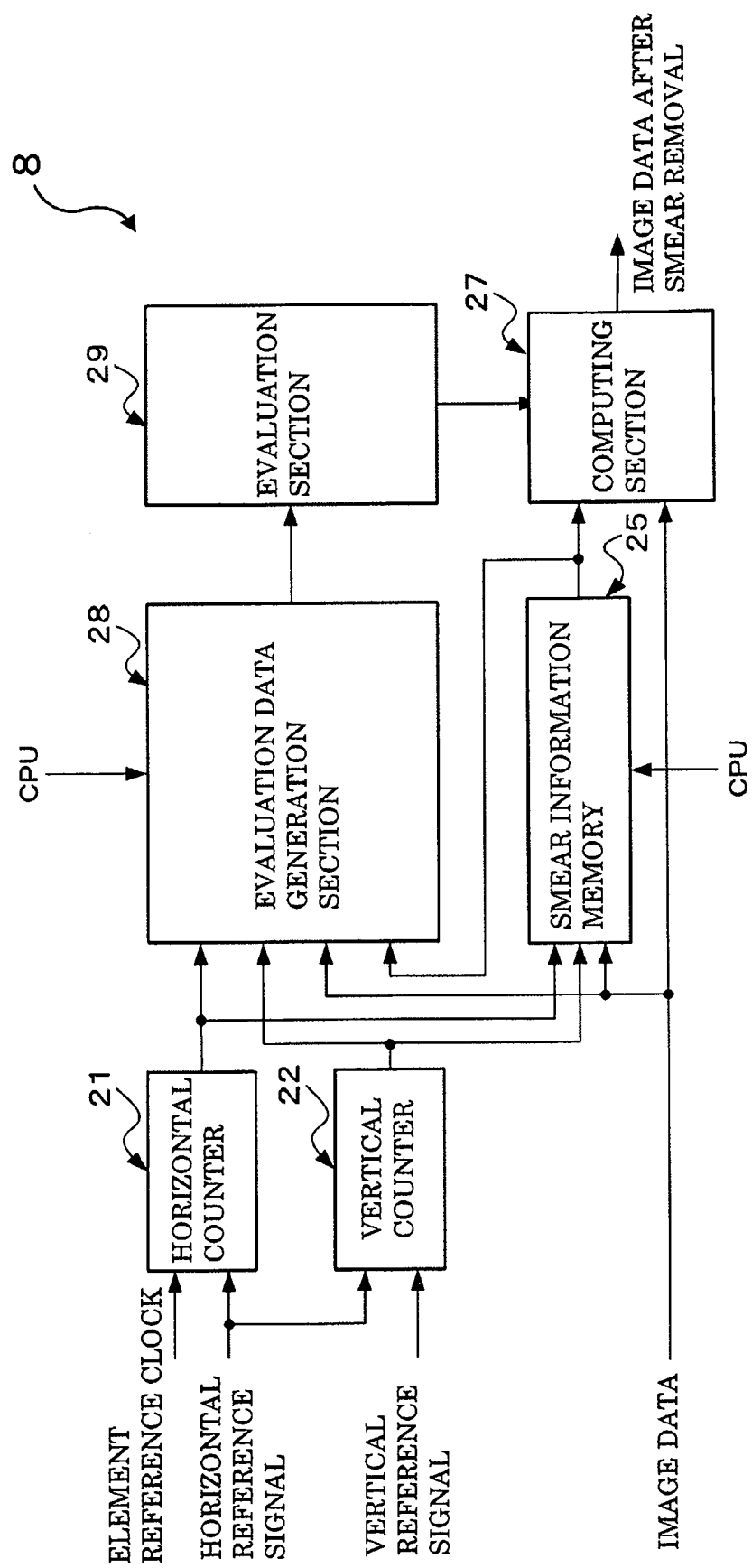
FIG. 11 is a block diagram showing an electrical outline structure of the smear removal processing section 8 in the second embodiment.

FIG. 11 is a block diagram showing an electrical outline structure of the smear removal processing section 8 in the second embodiment.

The smear removal processing section 8 is composed of the horizontal counter 21, the vertical counter 22, the smear information memory 25, the computing section 27, an evaluation data generation section 28, and an evaluation section 29. The components having the function which is similar to the components of the smear removal processing section 8 in the first embodiment are affixed with similar symbols.

The number counted by the horizontal counter 21, the number counted by the vertical counter 22, and the image data sent from the unit circuit 7 are inputted to the smear information memory 25. Further, the smear address information outputted from the CPU 9 is also inputted to the smear information memory 25.

The smear information memory 25 identifies the pixel data sent from the unit circuit 7 (finds what line and what column the pixel of the pixel data is located) from the numbers inputted from the horizontal counter 21 and the vertical counter 22. The smear information memory 25 judges whether or not the inputted pixel data is the pixel data corresponding to the smear address information sent from the CPU 9. When judged that the inputted pixel data is the pixel data corresponding to the smear information, the inputted pixel data is stored. In the second embodiment, the smear address information sent from the CPU 9 is information indicating a line in the vertical optical black region 1.

The number counted by the horizontal counter 21, the number counted by the vertical counter 22, and the pixel data sent from the unit circuit 7 are sequentially inputted to the evaluation data generation section 28. Further, the vertical OB address information outputted from the CPU 9 is also inputted to the evaluation data generation section 28. In the second embodiment, the vertical OB address information sent from the CPU 9 is information indicating a line in the vertical optical black region 2.

The evaluation data generation section 28 identifies the pixel data sent from the unit circuit 7 (finds what line and what column the pixel of the pixel data is located) from the numbers inputted from the horizontal counter 21 and the vertical counter 22. The evaluation data generation section 28 judges whether or not the inputted pixel data is the pixel data corresponding to the vertical OB address information sent from the CPU 9.

When the evaluation data generation section 28 judges that the inputted pixel data is the pixel data corresponding to the vertical OB address information, pixel data which is in the same column as the inputted pixel data is read out from the smear information memory 25, and the absolute value of the difference between the readout pixel data and the inputted pixel data is calculated. The calculated value is integrated, and the integrated value is stored in an integration register located in the evaluation data generation section 28. Here, the value obtained by integrating the absolute value of the difference of the pixel data is referred to as the difference integrated value.

Further, the evaluation data generation section 28 judges whether or not calculation and integration of the absolute value of the difference have been performed for the pixel data corresponding to the vertical OB address information sent from the CPU 9. That is, the evaluation data generation section 28 judges whether or not the difference integrated value has been calculated based on the pixel data corresponding to the vertical OB address information sent from the CPU 9.

When the evaluation data generation section 28 judges that the difference integrated value has been calculated for all the pixel data corresponding to the vertical OB address information, the evaluation data generation section 28 calculates the average value of the difference integrated values stored in the integration register, and outputs the calculated average value to the evaluation section 29. The average value can be obtained by adding all the difference integrated values stored in the integration register, and dividing the added value by the number of the added difference integrated values.

When the count of the vertical counter 22 is reset by the vertical reference signal, that is, when the output from the vertical counter 22 becomes 0, the evaluation data generation section 28 resets (deletes) the storage in the integration register.

The evaluation section 29 outputs a gain value corresponding to the average value sent from the evaluation data generation section 28 to the computing section 27. For the gain value corresponding to the average value, when the average value is lower than a third threshold, the gain value to be outputted is 1, and when the difference of the average values is higher than a fourth threshold, the gain value to be outputted is 0. In addition, when the average value is higher than the third threshold and lower than the fourth threshold, the gain value to be outputted is obtained by a relational expression of gain value=(the average value−fourth threshold)/(third threshold−fourth threshold), and the result is outputted to the computing section 27.

Thereby, by changing the gain value according to the average value of the differences for every column between the pixel data in the vertical optical black region 1 and the pixel data in the vertical optical black region 2, that is, the average value of the difference integrated values, presence of smear removal and intensity of smear removal effect are changed.

Since the functions of other components are similar to of the first embodiment, descriptions thereof will be omitted.

B-2. Operation of the Smear Removal Processing Section 8

Figure 12:
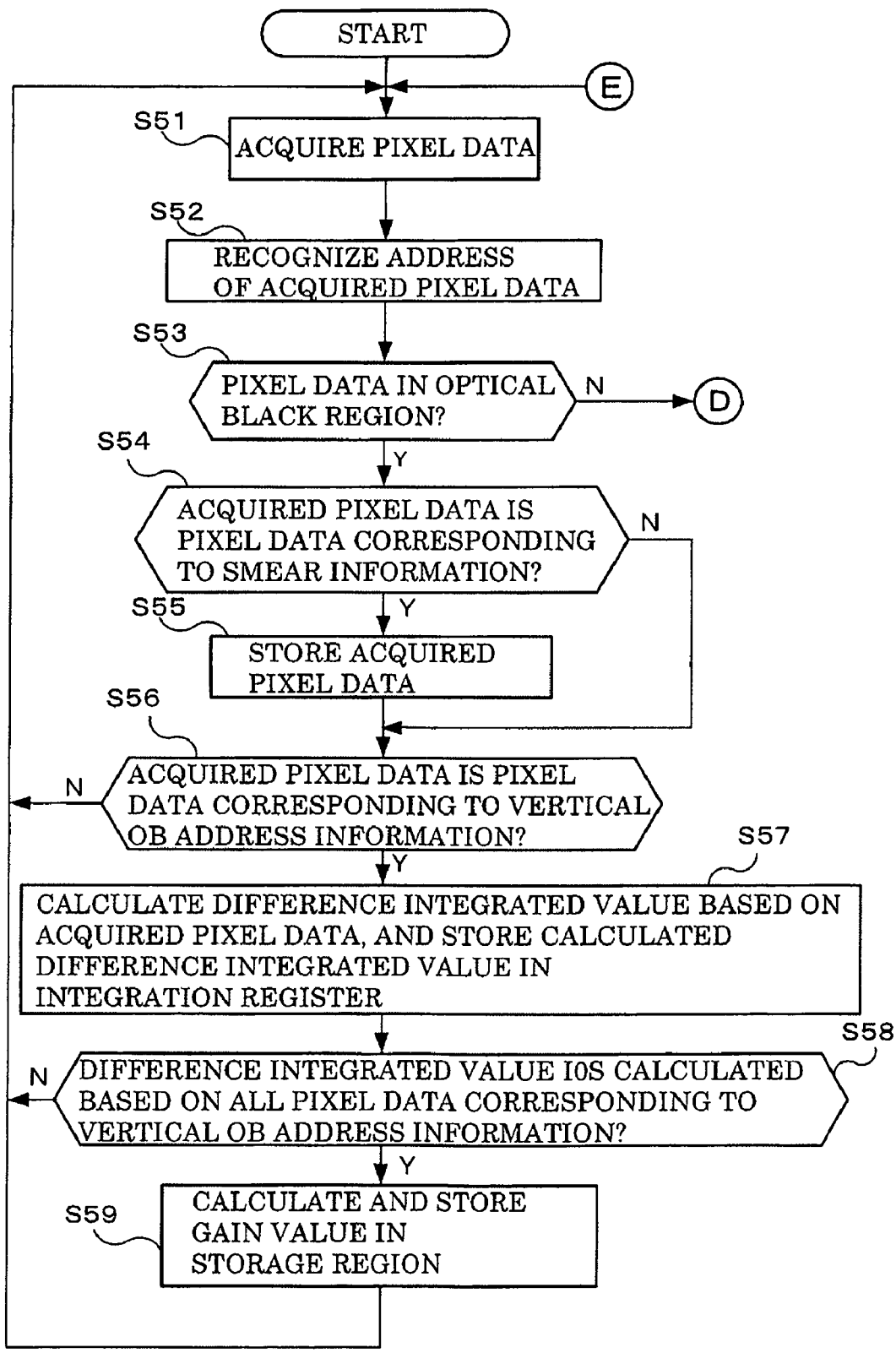
FIG. 12 is a flowchart showing operation of a digital camera in the second embodiment.

Operation of the smear removal processing section 8 in the second embodiment will be hereinafter described according to flowcharts of FIG. 12 and FIG. 13.

In Step S51, the smear removal processing section 8 acquires pixel data imaged by and outputted from the CCD 5 via the unit circuit 7.

Next, in Step S52, a pixel address of the acquired pixel data is recognized.

Next, in Step S53, whether or not the acquired pixel data is pixel data in the optical black region is judged based on the recognized pixel address.

When judged that the acquired pixel data is the pixel data in the optical black region in Step S53, the flow proceeds to Step S54. In Step S54, whether or not the acquired pixel data is the pixel data corresponding to the smear address information is judged.

When judged that the acquired pixel data is the pixel data corresponding to the smear information in Step S54, the flow proceeds to Step S55. In Step S55, the smear information memory 25 stores the acquired pixel data, and the flow proceeds to Step S56. Then, since the smear address information is information indicating a line in the vertical optical black region 1, pixel data in a line in the vertical black region 1 is stored as pixel data to be stored in the smear information memory 25.

Meanwhile, when judged that the acquired pixel data is not the pixel data corresponding to the smear address information in Step S54, the flow directly proceeds to Step S56.

In Step S56, whether or not the acquired pixel data is the pixel data corresponding to the vertical OB address information is judged.

When judged that the acquired pixel data is the pixel data corresponding to the vertical OB address information in Step S56, the difference integrated value is calculated, and the calculated difference integrated value is stored in the integration register in Step S57. Then, the flow proceeds to Step S58. That is, the evaluation data generation section 28 reads out pixel data in the same column as of the pixel of the acquired pixel data from the smear information memory 25, calculates the absolute value of the difference between the readout pixel data and the acquired pixel data, integrates the calculated value, and stores the integrated value in the integration register. Then, it is needless to say that the vertical OB address information is information indicating a line located in the vertical optical black region 2.

Meanwhile, when judged that the acquired pixel data is not the pixel data corresponding to the vertical OB address information in Step S56, the flow is directly returned to Step S1.

In Step S58, whether or not the difference integration value is calculated based on all pixel data corresponding to the vertical OB address information is judged.

When judged that the difference integrated value has been calculated based on all the pixel data corresponding to the vertical OB address information in Step S58, the average value of the difference integrated values stored in the integration register is calculated, a gain value corresponding to the calculated average value is obtained, the obtained gain value is outputted to the computing section 27, and the computing section 27 stores the sent gain value in the storage region in Step S59. Then, the flow is returned to Step S1.

Since the gain value is obtained based on the average value of the difference integrated values, presence of smear removal and intensity of smear removal effect can be changed according to the smear generation state.

Meanwhile, when judged that the difference integrated value has not been calculated based on all the pixel data corresponding to the vertical OB address information in Step S58, the flow is returned to Step S1.

Figure 13:
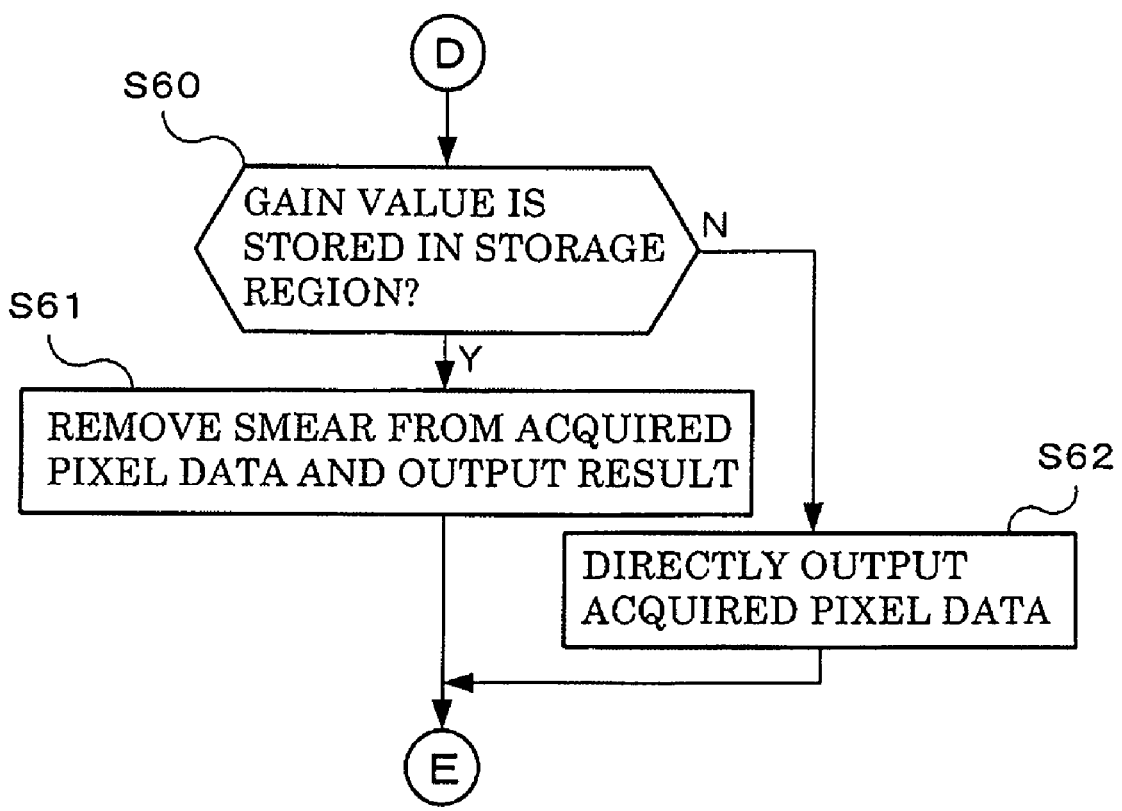
FIG. 13 is a flowchart showing operation of the digital camera in the second embodiment.

Meanwhile, when judged that the acquired pixel data is not the pixel data in the optical black region in Step S53, the acquired data is judged to be pixel data in the effective pixel region, and the flow proceeds to Step S60 of FIG. 13. In Step S60, whether or not a gain value has been stored in the storage region is judged. When judged that a gain value has been stored, the flow proceeds to Step S61. In Step S61, a smear element is removed from the acquired pixel data, and the result is outputted to the CPU 9. That is, by multiplying the pixel data stored in the smear information memory 25 by the gain value, and subtracting the multiplied value from the acquired pixel data, the smear element is removed. Then, the acquired pixel data and the pixel data stored in the smear information memory 25 to be subtracted are in the identical column.

Meanwhile, when judged that a gain value has not been calculated in Step S60, the acquired pixel data is directly outputted to the CPU 9 in Step S62.

B-3. Operational Effect

As above, in the second embodiment, the difference between pixel data in a line in the vertical optical black region 1 and pixel data in a line in the vertical optical black region 2 is calculated for every column, the average value of the calculated differences is obtained, and the intensity of smear removal effect is changed according to the obtained average value (gain value is changed). Therefore, the intensity of smear removal effect can be changed according to the smear generation state (whether or not smear is generated diagonally, and if yes, the diagonal degree of the smear). Thereby, deterioration of the S/N ratio and deterioration of the image quality associated with smear removal can be prevented. That is, artificiality of the whole image caused by smear removal in the section where smear is not generated can be prevented, because of being performed associated with smear removal where smear is generated.

For example, when smear is generated diagonally due to movement of the camera or movement of the object, the average value of differences between the pixel data in the vertical optical black region 1 and the pixel data in the vertical optical black region 2 becomes large, the gain value outputted from the evaluation section 29 becomes small, and the intensity of the smear removal effect becomes decreased. Performing smear removal when smear is generated diagonally produces the opposite effect of deterioration of the image quality.

On the contrary, when smear is hardly generated diagonally (when smear is generated vertically), the average value of differences between the pixel data in the vertical optical black region 1 and the pixel data in the vertical optical black region becomes small, the gain value outputted from the evaluation section 29 becomes large, and the intensity of the smear removal effect becomes increased. When smear is generated in the vertical direction, intensifying smear removal leads to more favorable image quality.

In the foregoing respective embodiments, the smear information memory 25 stores a line of pixel data in the vertical optical black region. However, it is possible that pixel data which is also pixel data in the horizontal optical black region among the pixel data in a line in the vertical optical black region is not be stored.

For example, descriptions will be given with reference to FIG. 5. When the pixel data to be stored in the smear information memory 25 is the pixel data in the zeroth line, the pixel data to be stored is the pixel data with pixel addresses from (3, 0), (4, 0) . . . (19, 0), and (20, 0). That is, of the pixel data in the zeroth line, the pixel data with pixel addresses of (0, 0), (1, 0), (2, 0), (21, 0), (22, 0), and (23, 0) is the pixel data located both in the vertical optical black region and in the horizontal optical black region.

The pixel data located both in the vertical optical black region and in the horizontal optical black region is pixel data not used in the step by the computing section 27. In the computing section 27, the pixel data which is in the same column as the pixel data of a pixel in the effective pixel region is read out from the smear information memory 25, and the readout pixel data is subtracted from the pixel data of the pixel in the effective pixel region. However, there is no pixel data in the effective pixel region which is in the same column as of the pixel data located both in the horizontal optical black and in the vertical optical black region.

Further, in the second embodiment, the case of pixel data in one line in the vertical optical black region 1, pixel data other than pixel data in the horizontal optical black region is stored in the smear information memory 25, the evaluation generation section 26 calculates the difference integrated value based on the pixel data other then the pixel data in the horizontal optical black region among the pixel data in a line in the vertical optical black region 2 and the pixel data stored in the smear information memory 25.

While in the foregoing second embodiment, the two thresholds as the third threshold and the fourth threshold are provided, however it is not limited to the above-mentioned style, the present invention includes the case of only one threshold being provided. It is possible that when the average value is lower than the threshold, the gain value to be outputted is 1 (smear removal is performed), and when the average value is higher than the threshold, the gain value to be outputted is 1 (that is, smear removal is not performed).

Further, while the difference integrated value is calculated by using pixel signals stored in the smear information memory 25, pixel signals in a line in the vertical optical black region 1 to calculate the difference integrated value may be stored in the evaluation generation section 28.

The digital camera 1 in the foregoing embodiments is not limited to the foregoing embodiments. For example, the present invention may be a mobile phone with camera features, a PDA with camera features, a personal computer with camera features, an IC recorder with camera features, a digital video camera or the like. In short, any apparatus which can photograph an object is applicable.

While the present invention has been described with reference to the preferred embodiments, it is intended that the invention be not limited by any of the details of the description therein but includes all the embodiments which fall within the scope of the appended claims.

What is claimed is:

1. An imaging apparatus, comprising:
    an image pickup device having a horizontal optical black region and a vertical optical black region;
    storage means for storing pixel signals in the vertical optical black region among pixel signals outputted from the image pickup device;
    first calculation means for calculating a value of pixel signals in the horizontal optical black region based on pixel signals of one or more pixels in the horizontal optical black region among the pixel signals outputted from the image pickup device;
    second calculation means for calculating a value of pixel signals in the vertical optical black region based on pixel signals of one or more pixels in the vertical optical black region among the pixel signals outputted from the image pickup device;
    output means for outputting a gain value corresponding to a difference between the value calculated by the first calculation means and the value calculated by the second calculation means;
    control means for multiplying a pixel signal stored in the storage means by the gain value outputted from the output means;
    subtraction means for subtracting the multiplied pixel signal from a pixel signal outputted from the image pickup device.

2. The imaging apparatus according to claim 1, wherein the output means outputs the gain value of 0 when an absolute value of the difference between the value calculated by the first calculation means and the value calculated by the second calculation means is smaller than a first threshold.

3. The imaging apparatus according to claim 2, wherein the output means outputs the gain value of 1 when the absolute value of the difference between the value calculated by the first calculation means and the value calculated by the second calculation means is larger than a second threshold.

4. The imaging apparatus according to claim 3, wherein the output means outputs the gain value obtained by a relational expression of gain value =(the absolute value of the difference between the values-the first threshold)/(the second threshold-the first threshold) when the absolute value of the difference between the value calculated by the first calculation means and the value calculated by the second calculation means is larger than the first threshold and smaller than the second threshold.

5. The imaging apparatus according to claim 2, wherein the output means outputs the gain value obtained by a relational expression of gain value =(the absolute value of the difference between the values-the first threshold)/(the second threshold-the first threshold) when the absolute value of the difference between the value calculated by the first calculation means and the value calculated by the second calculation means is larger than the first threshold and smaller than the second threshold.

6. The imaging apparatus according to claim 1, wherein:
    the first calculation means obtains an average value of pixel signals in the horizontal optical black region based on pixel signals of one or more pixels in the horizontal optical black region; and
    the second calculation means obtains an average value of pixel signals in the vertical optical black region based on pixel signals of one or more pixels in the vertical optical black region.

7. The imaging apparatus according to claim 1, wherein the storage means stores pixel signals in a given line in the vertical optical black region among the pixel signals outputted from the image pickup device.

8. The imaging apparatus according to claim 7, wherein the storage means does not store pixel signals which are also pixel signals in the horizontal optical black region among the pixel signals in a given line in the vertical optical black region.

9. The imaging apparatus according to claim 1, wherein the first calculation means calculates the value based on pixel signals of pixels in a same column when the value of pixel signals in the horizontal optical black region is calculated based on pixel signals of two or more pixels.

10. The imaging apparatus according to claim 1, wherein the second calculation means calculates the value based on pixel signals of pixels in a same line when the value of pixel signals in the vertical optical black region is calculated based on pixel signals of two or more pixels.

11. The imaging apparatus according to claim 1, wherein:
the control means multiplies a pixel signal stored in the storage means which is in a same column as a pixel signal outputted from the image pickup device by the gain value outputted from the output means, and
the subtraction means subtracts the multiplied pixel signal from the pixel signal outputted from the image pickup device.

12. A computer-readable medium storing a computer program that is executable by a processor to perform functions comprising:
outputting charge accumulated in an image pickup device having a horizontal optical black region and a vertical optical black region as pixel signals;
storing pixel signals in the vertical optical black region among the outputted pixel signals;
first calculating a value of pixel signals in the horizontal optical black region based on pixel signals of one or more pixels in the horizontal optical black region among the outputted pixel signals;
second calculating a value of pixel signals in the vertical optical black region based on pixel signals of one or more pixels in the vertical optical black region among the outputted pixel signals;
outputting a gain value corresponding to a difference between the first calculated value and the second calculated value;
multiplying a stored pixel signal by the outputted gain value;
subtracting the multiplied pixel signal from an outputted pixel signal outputted from the image pickup device.

13. A smear removal apparatus, comprising:
acquisition means for acquiring pixel data outputted from an image pickup device having a horizontal optical black region and a vertical optical black region;
storage means for storing pixel signals in the vertical optical black region among the pixel signals acquired by the acquisition means;
first calculation means for calculating a value of pixel signals in the horizontal optical black region based on pixel signals of one or more pixels in the horizontal optical black region among the pixel signals acquired by the acquisition means;
second calculation means for calculating a value of pixel signals in the vertical optical black region based on pixel signals of one or more pixels in the vertical optical black region among the pixel signals acquired by the acquisition means;
output means for outputting a gain value corresponding to a difference between the value calculated by the first calculation means and the value calculated by the second calculation means;
control means for multiplying a pixel signal stored in the storage means by the gain value outputted from the output means;
subtraction means for subtracting the multiplied pixel signal from a pixel signal outputted from the image pickup device.

* * * * *